United States Patent
Somayajula (12)

(10) Patent No.: US 6,559,789 B1
(45) Date of Patent: May 6, 2003

(54) HIGH SPEED SUCCESSIVE APPROXIMATION RETURN PATH AND DATA CONVERSION METHODS AND CIRCUITS USING THE SAME

(75) Inventor: Shyam S Somayajula, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/919,014

(22) Filed: Jul. 30, 2001

(51) Int. Cl.[7] .............................................. H03M 1/12
(52) U.S. Cl. ........................ 341/172; 341/155; 341/163
(58) Field of Search ............................... 341/118, 120, 341/144, 172, 163

(56) References Cited

U.S. PATENT DOCUMENTS

| | | | | |
|---|---|---|---|---|
| 4,654,815 A | * | 3/1987 | Marin et al. ................. | 341/118 |
| 4,831,381 A | * | 5/1989 | Hester ......................... | 341/162 |
| 4,982,194 A | * | 1/1991 | Bacrania et al. ............. | 341/172 |
| 5,177,484 A | * | 1/1993 | Bruckmann .................. | 341/172 |
| 5,576,708 A | * | 11/1996 | De Wit ........................ | 341/118 |
| 5,606,320 A | * | 2/1997 | Kleks ........................... | 341/118 |
| 5,638,072 A | * | 6/1997 | Van Auken et al. ........ | 341/141 |
| 5,959,565 A | * | 9/1999 | Taniuchi et al. ............. | 341/172 |
| 6,097,326 A | * | 8/2000 | Opris et al. .................. | 341/161 |
| 6,445,331 B1 | * | 9/2002 | Stegers ........................ | 327/337 |

OTHER PUBLICATIONS

McCreary, Gray "ALL–MOS Charge Redistribution Analog to Digital Conversion Techniques—Part I", IEEE Journal/Solid–States Circuits, vol., SC10, p. 371–379, Dec. 1975.
Suarez, Gray, & Hodges "All–MOS Charge Redistribution Analog–to–digital Conversion Techniques –Part II" IEEE Journal/Solid State Circuits, vol. SC10, p. 379–385, Dec. 1975.

* cited by examiner

Primary Examiner—Peguy JeanPierre
(74) Attorney, Agent, or Firm—James J. Murphy, Esq.; Winstead Sechrest & Minick

(57) ABSTRACT

A return path for use in a switched capacitor circuit includes an array of capacitors and a plurality of switches for selectively coupling voltages to capacitors. A set of latches selectively controls the plurality of switches during time periods partitioned into non-overlapping reset and set cycles. During a first such time period, a selected one of the capacitors is decoupled from a current voltage during the reset cycle and coupled to a selected reference voltage during the set cycle.

16 Claims, 5 Drawing Sheets

HIGH SPEED SUCCESSIVE APPROXIMATION RETURN PATH AND DATA CONVERSION METHODS AND CIRCUITS USING THE SAME

CROSS REFERENCE TO RELATED APPLICATIONS

This application for patent is related to the following applications for patent:

Pending U.S. patent application Ser. No. 09/919,181, filed Jul. 30, 2001 by inventor Somayajula, entitled "CIRCUITS AND METHODS FOR OFFSET VOLTAGE COMPENSATION IN A CHARGE REDISTRIBUTION DIGITAL TO ANALOG CONVERTER" currently pending; and U.S. patent application Ser. No. 09/919,411, filed Jul. 30, 2001 by inventor Somayajula, entitled "CIRCUITS AND METHODS FOR LATCH METASTABILITY DETECTION AND COMPENSATION AND SYSTEMS USING THE SAME" currently pending U.S. patent application Ser. No. 09/919,410, filed Jul. 30, 2001 by inventor Somayajula, entitled "ANALOG TO DIGITAL CONVERSION CIRCUITS, SYSTEMS AND METHODS WITH GAIN SCALING SWITCHED-CAPACITOR ARRAY" granted Oct. 29, 2002 as U.S. Pat. No. 6,473,021 B1;

U.S. patent application Ser. No. 09/918,852, filed Jul. 30, 2001 by inventor Somayajula, entitled "CIRCUITS AND METHODS FOR LINEARIZING CAPACITOR CALIBRATION AND SYSTEMS USING THE SAME" granted Sep. 10, 2002 as U.S. Pat. No. 6,448,911 B1;

U.S. patent application Ser. No. 09/918,616, filed Jul. 30, 2001 by inventor Somayajula, entitled "HIGH SPEED, LOW-POWER SHIFT REGISTER AND CIRCUITS AND METHODS USING THE SAME" granted Dec. 3, 2002 as U.S. Pat. No. 6,490,332 B1; and U.S. patent application Ser. No. 09/919,02, filed Jul. 30, 2001 by inventor Somayajula, entitled "METHODS AND CIRCUITS FOR COMPENSATING FOR FINITE COMMON MODE REJECTION IN SWITCHED CAPACITOR CIRCUITS" currently pending.

FIELD OF INVENTION

The present invention relates in general to switched capacitor circuits and in particular to a high speed successive approximation return path and data conversion methods and circuits using the same

BACKGROUND OF INVENTION

One particular technique for performing analog to digital (A/D) conversion is through successive approximation. The basic successive approximation A/D converter (ADC) includes an analog comparator and a clocked feedback loop having a successive approximation register (SAR) and a digital to analog converter (DAC).

Generally, the analog input signal voltage is sampled onto an array of weighted capacitors, during the sampling phase, the top plates of which are coupled to one comparator input. The other comparator input is coupled to a comparison voltage, which could be a fixed reference voltage in a single-ended system or the voltage at the top plates of second capacitor array in a differential system.

During the first clock cycle of the subsequent conversion phase, the bottom plate of the capacitor representing the digital most significant bit (MSB) is coupled to a reference voltage while the bottom plates of the remaining capacitors in the array are coupled to ground or a second reference voltage (ground will be assumed here). The new top plate voltage appears at the input of the comparator and is compared against the comparison voltage. The new top plate voltage is a scaled version of $$\left[\frac{V_{oef}}{2} - ain\right] \cdot k$$

where k is the ratio of capacitors. The sign of this quantity is the factor of interest. If the new top plate voltage is below the comparison voltage, then the MSB is "kept" by the SAR in the feedback loop by maintaining its bottom plate coupled to the reference voltage. On the other hand, if the top plate voltage is above the comparison voltage, the SAR couples and the bottom plate of the MSB capacitor to ground. The state of the MSB capacitor represents the MSB of the digital output word as a Logic 1. The bottom plate of the second MSB is then coupled to the reference voltage and the same test is performed to determine the state of the next digital code bit. The successive approximation algorithm continues by repeating this procedure for the remaining capacitors in the array such that the voltage difference at the inputs to the comparator converge to zero. At the end of this bit cycling process, the configuration of the switches coupling the bottom plates either to Vref or Gnd represents the input sample in digital form.

Successive approximation A/D converters are useful a wide range of applications, including data acquisition, test equipment, instrumentation, cellular communications, among others. Notwithstanding, in order to improve and broaden the utility of this type of A/D converter, significant challenges remain to be addressed. These challenges include improving the device speed given a set of process constraints, reducing the coding error rate, handling metastable states and calibration of the DAC.

SUMMARY OF INVENTION

The present inventive principles are embodied in high speed return paths for use in switched capacitor circuits including an array of capacitors and a plurality of switches for selectively coupling voltages to the capacitors. According to one such embodiment, a set of latches is provided for selectively controlling the plurality of switches during time periods partitioned into non-overlapping reset and set cycles. During the reset cycle, a selected capacitor is decoupled from a current voltage and during the set cycle, the selected capacitor is coupled to a selected reference voltage.

The present inventive concepts are also disclosed in methods for converting bits in charge redistribution analog to digital converters. According to one such method, an input signal is sampled by coupling first and second capacitors to an analog input by setting a first set of latches controlling a first set of switches during a first set cycle. A first bit is then tested during a first conversion period. The first and second capacitors are decoupled from the analog input by resetting the first set of latches controlling the first set of switches. The first capacitor is then coupled to a first reference voltage and the second capacitor to a second reference voltage by setting a second set of latches controlling a second set of switches.

Circuits and methods embodying the principles summarized above have substantial advantages over existing successive approximation return paths. Among other things, the delay introduced into the data conversion process by traditional Break-Before-Make switching logic is substantially reduced or eliminated. At the same time, contention problems which could result if two switches to the same capacitor are closed simultaneously, are advantageously avoided.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–6C of the drawings, in which like numbers designate like parts.

Figure 1:
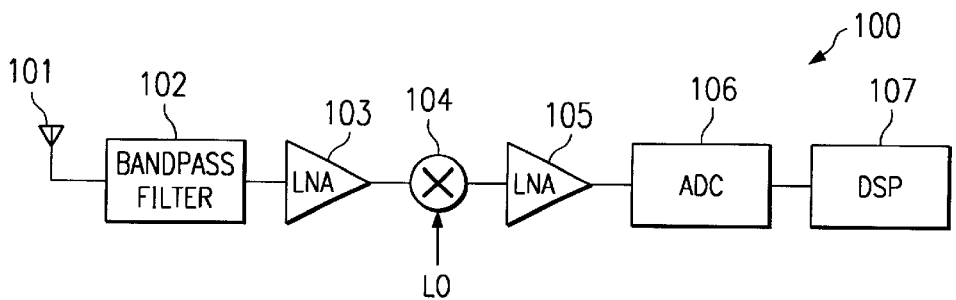
FIG. 1 is a high level block diagram of a digital receiver suitable for describing the principles of the present invention.

FIG. 1 is a high level block diagram of a digital receiver 100 suitable for describing the principles of the present invention. Generally, receiver 100 includes an RF input port or antenna 101 for receiving an RF signal, such as those used in telecommunications, and radio and television transmission. The desired RF signal is then extracted from the received signal by a bandpass filter 102. A low noise amplifier (LNA) 103 sets the system noise figure before the RF signal is downconverted in frequency by a mixer stage 104 operating in response to a local oscillator (LO). The output of mixer stage 104 may be passed through a second low noise amplifier (LNA) 105 before conversion into the digital domain.

Figure 2:
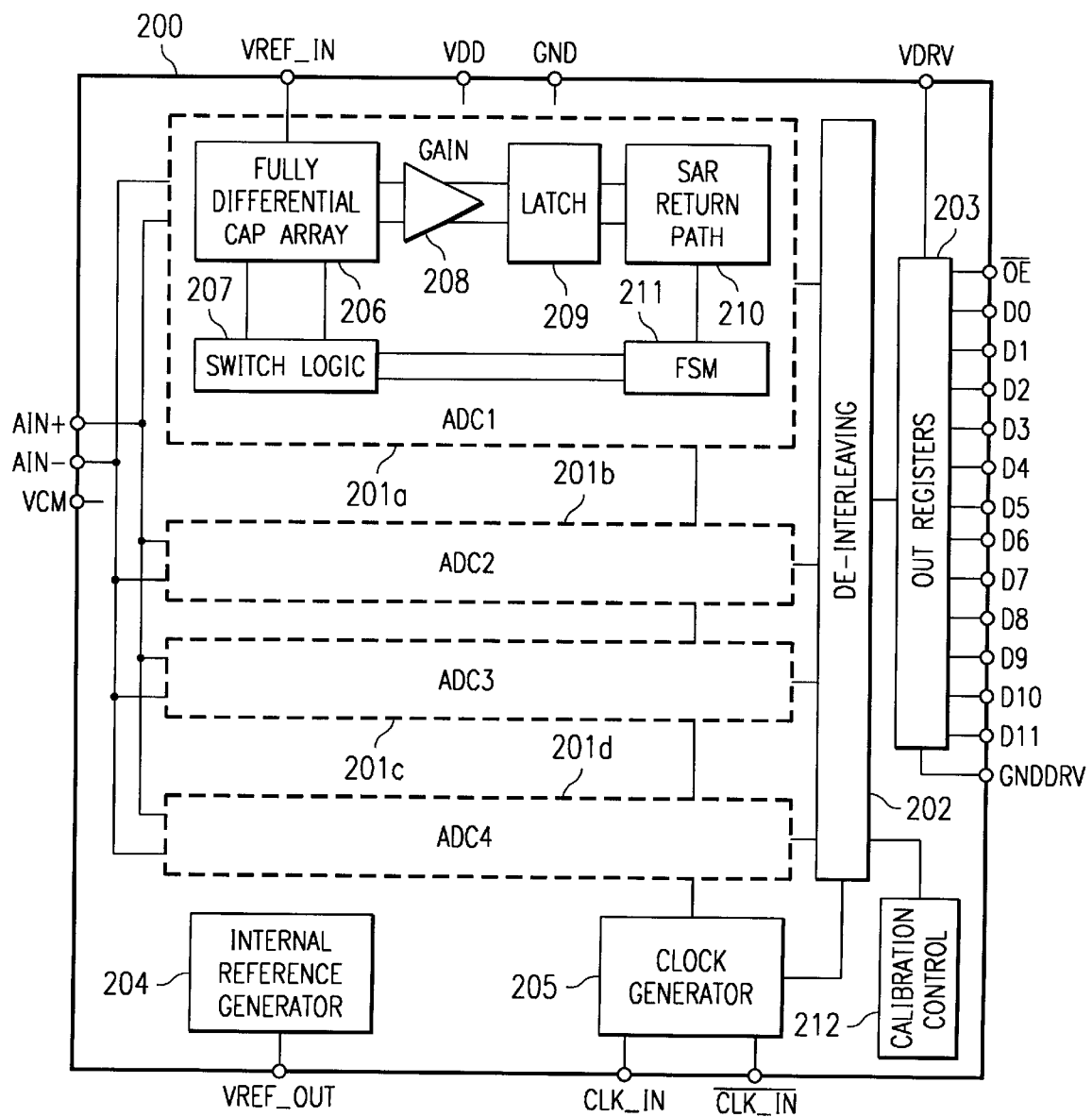
FIG. 2 is a high level functional block diagram of a single-chip analog to digital converter suitable for describing the present inventive concepts.

In system 100, analog to digital conversion is performed using analog to digital converter (ADC) 200 discussed in detail below. Once converted into the digital domain, the received data can be processed using a digital signal processor FIG. 2 is a high level functional block diagram of a single-chip analog to digital converter 200 suitable for describing the present inventive concepts. A/D converter 200 is based on 4 interleaved successive-approximation A/D converters (ADCs) 201, which will be discussed further below. The digitally coded samples are de-interleaved in block 202 and output through output register 203. A/D converter 200 also includes an on-chip reference voltage generator 204, clock generator 205 and clock generation circuitry 206.

Each of the ADCs 202 includes a fully differential capacitor array 206 under control of switch control circuitry 207 which implements the charge redistribution DAC discussed below. During the tracking mode, capacitor array 206 samples the input voltage at the differential analog inputs AIN+ and AIN−. During the hold mode, the sampled charge is held while the successive approximation algorithm generates the digital bits.

A gain stage 208 with minimal gain provides signal isolation in front of latch (comparator) 209. SARI return path 210 and FSM 211 feedback determine whether a bit is kept (i.e. corresponding capacitor remains coupled to the reference voltage) or not kept (i.e. the corresponding capacitor is recoupled to ground).

In a conventional charge redistribution DAC, the bottom plate of a graduated (bit-weighted) filter array is coupled to the input during the sampling phase and all capacitors are charged to the input signal voltage. After the capacitors are charged, their bottom plates are coupled to ground during hold phase such that the top plates of the capacitors are at a voltage $V_X$ which is approximately equal to $-A_{IN}$, where $A_{IN}$ is the input sample voltage. During bit cycling, the bottom plate of the capacitor representing the MSB is coupled to the reference and the voltage of the top plate compared against the reference. The bottom capacitors of the remaining capacitors remain coupled to ground to form a voltage divider. If upper plate voltage is now below the reference, then the MSB capacitor continues to be coupled to the reference (i.e. the bit is kept), otherwise the bottom plate of the capacitor is recoupled to ground (i.e. the bit is not kept).

Figure 3:
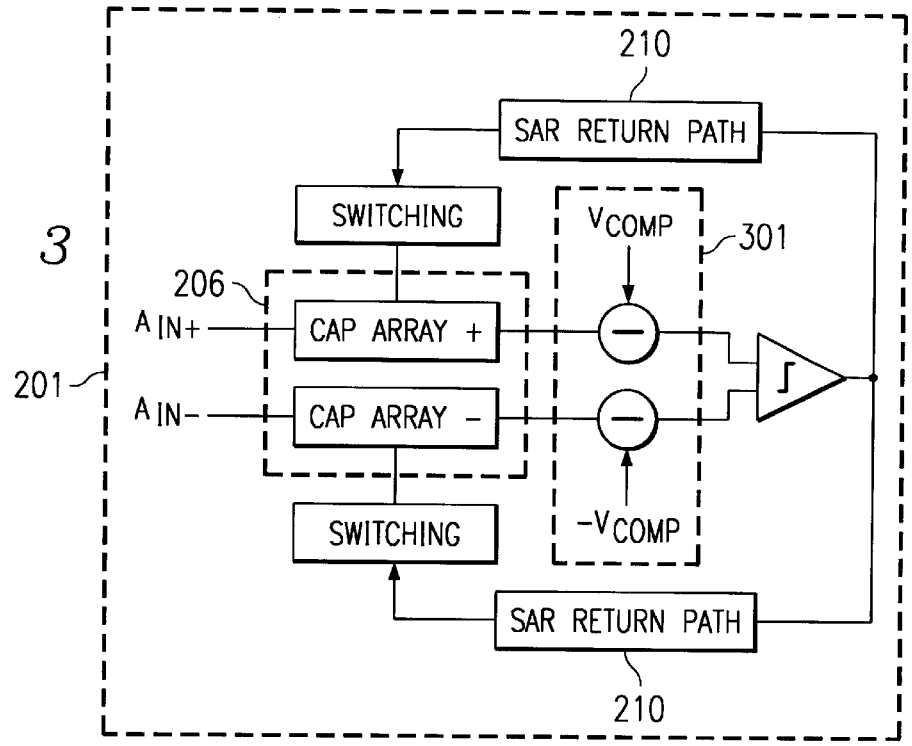
FIG. 3 is a high level functional diagram of one offset compensation circuit according to the principles of the present invention.

One circuit embodiment of the principles of the present invention is shown in FIG. 3. In this case, an error cancellation (compensation) stage 301, which is preferably a subtractor, is placed in front of the comparator. This cancellation stage presents a voltage to the comparator inputs, as determined during a calibration procedure, and cancels out the input voltage offset. Cancellation stage 301 performs the cancellation operation in the analog domain, although its control is performed in the digital domain. A preferred charge redistribution DAC suitable with an integral offset compensation (cancellation) circuitry is discussed below in conjunction with FIG. 4. It should be noted that the present invention is not limited to error compensation loops utilizing charge redistribution DACs. In alternative embodiments, the DAC can also be a resistor-based DAC or a current-based DAC.

Figure 4A:
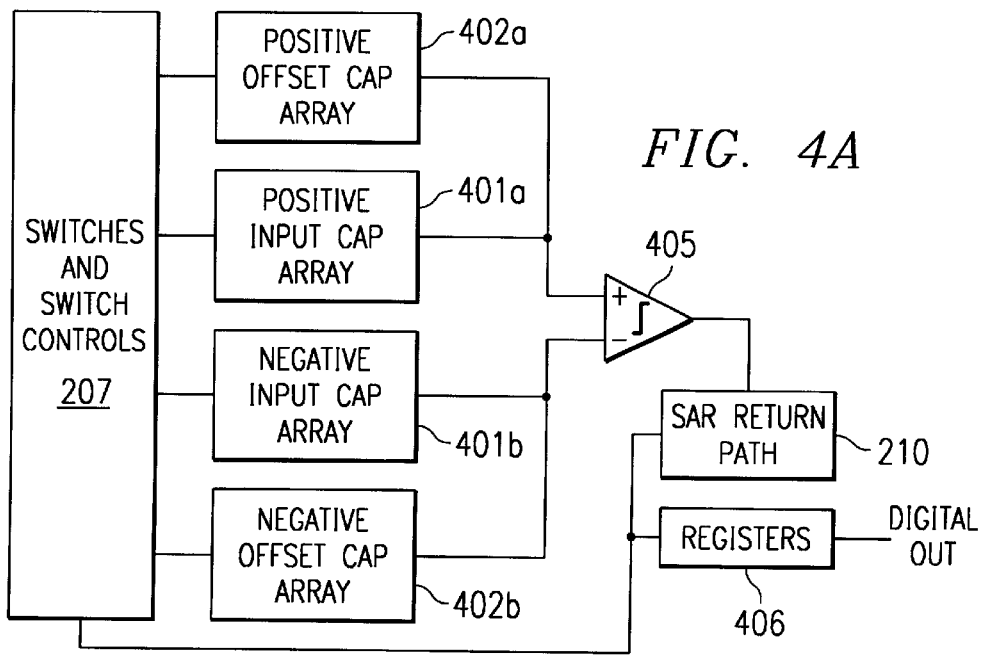
FIG. 4A is a functional block diagram of a switched-capacitor charge redistribution ADC embodying the present principles.

A switched-capacitor charge redistribution DAC 400 embodying the present principles is shown in FIG. 4A. In this embodiment, two capacitor arrays are provided for each of the paths into the positive and negative differential inputs into comparator 404, namely, Input Capacitor Array 401 and Offset Compensation Capacitor Array 402. One pair of arrays 401 and 402 is shown in further detail in FIG. 4B. Input Capacitor Array 401 comprises a termination capacitor $C_T$ and an array of capacitors $C_{INi}$, i=1 to m graduated in the sequence C, 2C, 4C, ... $2^{m-2}$C, $2^{m-1}$C(ff). In the following discussion, input capacitors 401 coupled to the positive comparator input are designated $C_{INPi}$ and those coupled to the negative comparator input designated $C_{INNi}$. Generally, the termination capacitors do not participate in the bit-cycling process, except during capacitance calibration (trim) operations.

Offset Compensation Capacitor Array 402, comprises a termination capacitor $C_T$ and an array of capacitors $C_{OFFj}$, j=1 to n, graduated in the sequence C, 2C, 4C, . . . $2^{n-2}$C, $2^{n-1}$C (ff). Offset capacitors coupled to the positive comparator input are designated $C_{OFFPj}$ and those coupled to the negative comparator input $C_{OFFNj}$.

The bottom plate of each capacitor in array 401 is associated with a set of switches 403, one of which is shown in further detail. Specifically, each input array switch set includes a switch $S_{AINi}$ for coupling the plate to the analog input voltage $A_{IN+}$ or $A_{IN-}$, a switch $S_{VRi+}$ for coupling to the positive reference voltage rail $V_{REF+}$, a switch $S_{GNDi}$ for coupling to the negative reference rail $V_{REF-}$, in this case GND, and a switch $S_{CMi}$ for coupling to the input common mode voltage $V_{CMI}$ referenced to the differential inputs $A_{IN+}$ and $A_{IN-}$.

A similar set of switches 404, indexed j=1 to m, selectively couple the bottom plates of the capacitors of offset array 402 to the input signal ($A_{IN+}$ or $A_{IN-}$) and the reference voltage ($V_{REF+}$) and GND. After the SAR bit cycling process, the state of switches 403 represent the digitally coded input sample and is stored in registers 406 for output.

An offset calibration cycle is run to selectively charge the capacitors of the offset arrays 402a,b at the positive and negative inputs to the comparator. In the following discussion, "complementary" sets of capacitors are those coupled by the appropriate switches at a given instant to opposing reference voltages. For example, if capacitor $C_{INPi}$ in input array 401a at the positive comparator input is coupled to $V_{REF}$, then the corresponding capacitor in $C_{INi}$ in input array 401b at the negative comparator input is coupled to GND, and vice versa. Similarly, if a capacitor $C_{OFFPj}$ in offset array 402a is coupled to $V_{REF}$, capacitor $C_{OFFNj}$ in offset array 402b is coupled to GND, and vice versa.

During the sampling phase of the calibration procedure, the bottom plates of all input capacitors $C_{INPi}$ (i=1 to m) and $C_{INi}$ (i=1 to m) are coupled to the input common mode voltage $V_{CMi}$. The MSB capacitor $C_{OFFMSBP}$ of the positive path capacitor array is coupled to $V_{REF}$ and the complementary MSB capacitor $C_{OFFMSBN}$ is coupled to Gnd. The bottom plates of the remaining positive path offset capacitors $C_{OFFLSBP}$ are coupled to ground and those of the remaining negative path offset capacitors $C_{OFFLSBN}$ are coupled to $V_{REF}$. The top plates of all the input and offset capacitors, for both paths are coupled to a common voltage according to the comparator design. For a more complete discussion of the compensation reference is now made to copending, coassigned patent application Ser. No. 09/919, 181 incorporated above by reference During the calibration conversion phase, a SAR bit cycling process is then performed using only the offset capacitors $C_{OFFPj}$ and $C_{OFFNJ}$. The bits on the offset capacitors approximate the inverse of the offset voltage $V_{OFF}$. During this process, the bottom plates of the input capacitors remains coupled to $V_{cmi}$. The calibration conversion phase is illustrated in FIG. 5B.

During the calibration conversion phase, a SAR bit cycling process is then performed using only the offset capacitors $C_{OFFPj}$ and $C_{OFFNj}$. The bits on the offset capacitors after bit cycling approximate the inverse of the offset voltage $V_{OFF}$, such that the bit positions of the corresponding switches represent the offset compensation code. During this process, the bottom plates of the input capacitors are coupled to ground During subsequent normal mode operation, the input capacitors $C_{INPi}$ and $C_{INNi}$ are coupled to the system inputs to sample the differential analog inputs $A_{INP}$ and $A_{INN}$. During normal mode sampling, the MSB offset capacitor of the positive path and the LSB offset capacitor of the negative path are coupled to $V_{REF}$ while the LSB offset capacitors of the positive path and the MSB capacitor of the negative path are coupled to ground. A SAR bit cycling operation is then performed on the input capacitors $C_{INPi}$ and $C_{INNi}$. During the normal operation conversion phase, the offset capacitors $C_{OFFPj}$, and $C_{OFFNj}$ are selectively coupled to $V_{REF}$ and ground to reflect the offset compensation codes as determined during the calibration operations.

Figure 5:
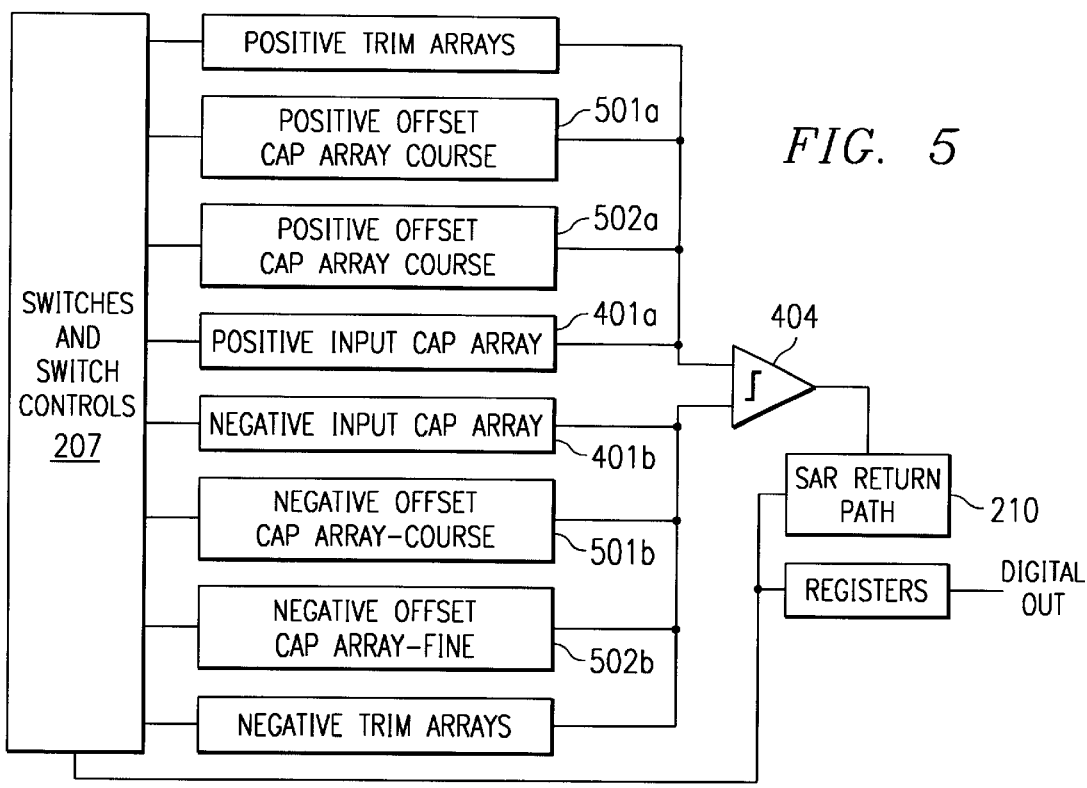
FIG. 5 is a functional block diagram of a second charge redistribution ADC embodying the present principles.

An alternate embodiment is depicted in FIG. 5 Here, two offset arrays are provided at each of the comparator inputs.

Specifically, each input is associated with a coarse offset array 501 and a fine offset array 502. Structurally, these arrays are similar to offset arrays 402 discussed above and include an array of weighted capacitors and a corresponding set of switches. The number of weighted capacitors in the coarse and fine arrays are not necessarily equal. For example, the coarse array could be an 5-bit array and the fine array a 8-bit array.

During the sampling phase of calibration, the MSB capacitors of the both coarse and fine arrays of the positive input path are coupled to $V_{REF}$ while the MSB capacitors of the coarse and fine arrays of the negative input path are coupled of Gnd. The remaining capacitors in both the coarse and fine arrays of the positive input path are coupled to Gnd while those of the negative input path are coupled to $V_{REF}$. The input capacitors sample $V_{cmi}$ as discussed above.

During the calibration conversion phase, a bit cycling operation is first performed through coarse arrays 501 followed by a bit cycling operation through the fine arrays 502. The results are coarse and fine offset codes for the positive and negative input paths.

The normal mode sample conversion is performed in a manner similar to that discussed above. During the sampling phase, with the MSB capacitors of the fine and coarse offset compensation arrays of the positive path coupled to $V_{REF}$ and those of the fine and coarse offset compensation arrays of the negative path coupled of Gnd. The remaining (LSB) capacitors of the positive path fine and coarse arrays are coupled to Gnd the remaining (LSB) capacitors of the negative path coupled to $V_{REF}$.

During the normal mode conversion phase, the offset codes determined during calibration are set into the fine and coarse arrays of both the positive and negative input paths. A bit cycling is then performed through the input capacitor arrays $C_{INTOTN}$ and $C_{INTOTP}$, as previously described.

Figure 4B:
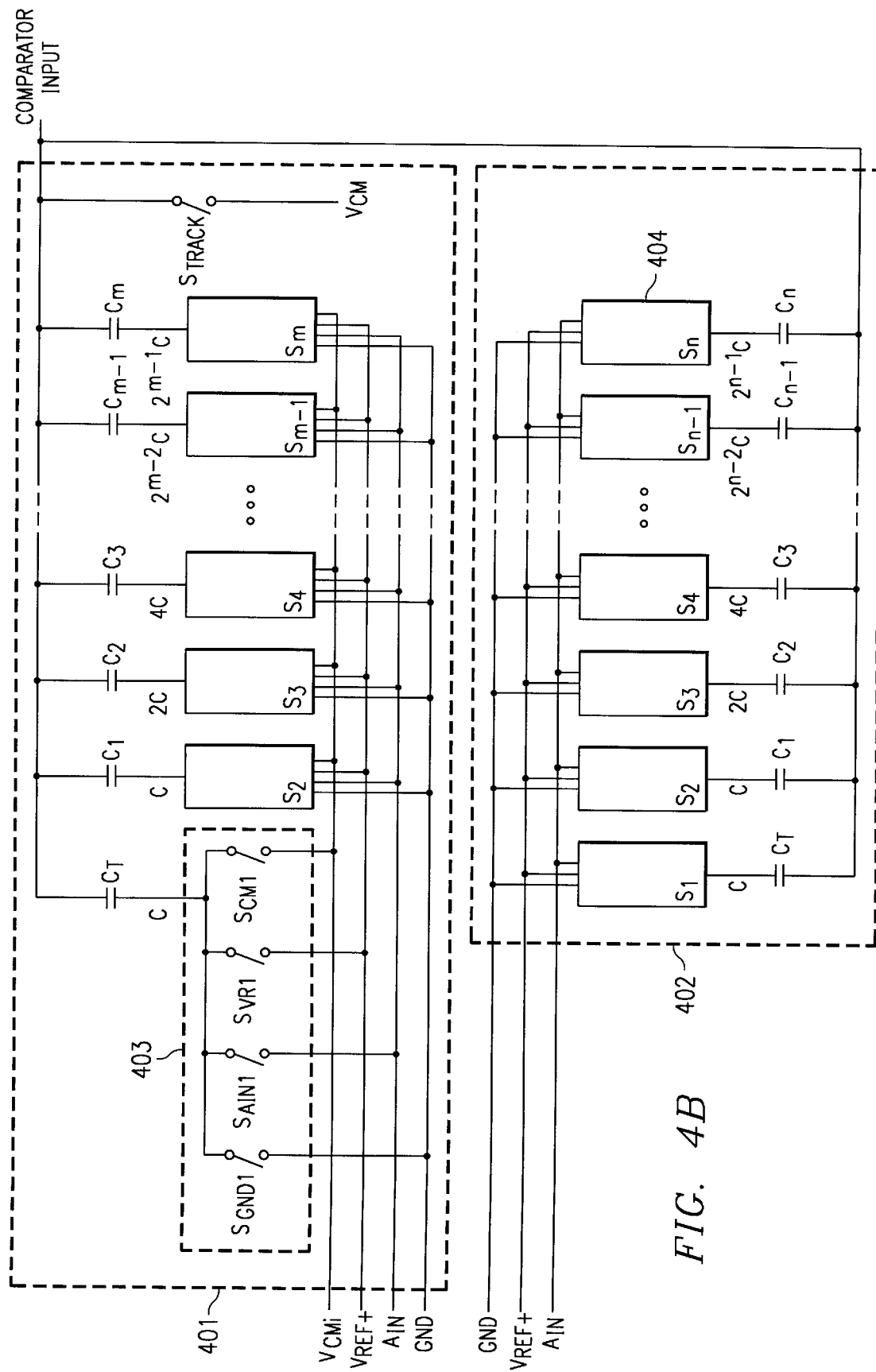
FIG. 4B illustrates one pair of the capacitor arrays of FIG. 4A, in further detail.

As shown in FIG. 4B, switching arrays 403/404 selectively couple the capacitors of arrays 401/402 to at least three primary voltages, namely $A_{IN}$, $V_{REF}$, and Gnd, as well as $V_{CM}$ in embodiments supporting offset calibration. For the most part, a given capacitor is only coupled to a single one of these voltages at one time. Hence, some provision must be made to insure that only one switch 403 per capacitor is closed at a given time to avoid contention problems.

In conventional SAR charge redistribution circuits, capacitor switching is normally implemented using Break-Before-Make (definite non-overlap) circuitry. Here, all the switches controlling a given capacitor are opened (break) before any one switch is closed (make). For example, consider the switches controlling the voltage on the capacitor representing the most significant bit. During sampling, switch $S_{AINMSB}$ is closed and switches $S_{VRMSB}$ and $S_{GndMSB}$ are open. Switch $S_{AIN}$ is then opened before switch $S_{VR}$ is closed to perform the bit test during the conversion phase. If the bit is kept, then switch $S_{VRMSB}$ remains closed and switch $S_{VRMSB-1}$ for the next capacitor is closed to test the next most significant bit. On the other hand, if the current bit is not kept, then switch $S_{VRMSB}$ must first be opened before switches $S_{GndMSB}$ and $S_{VRMSB-1}$ are closed. In this way, the proper voltages always independently appear on the capacitor bottom plates.

While traditional Break-Before-Make logic solves the contention problem, it also disadvantageously introduces a delay into the data conversion process. Generally, the more signals (e.g. $V_{REF}$, $V_{CM}$, Gnd, $A_{IN}$) that must be arbitrated, the more gates are required in the Break-Before-Make circuitry. Each gate introduces a certain amount of gate delay. For high performance applications, these gate delays are typically unacceptable.

According to the present concepts, a high speed SAR return path 210 eliminates the gate delays found in conventional SAR circuits. As discussed below in further detail, a set of latches are used in the return path between the output of comparator/latch 209 and switch arrays 403/404. These latches are used to implement the Break-Before-Make function with a compact timing which conserves clock cycles.

Figure 6A:
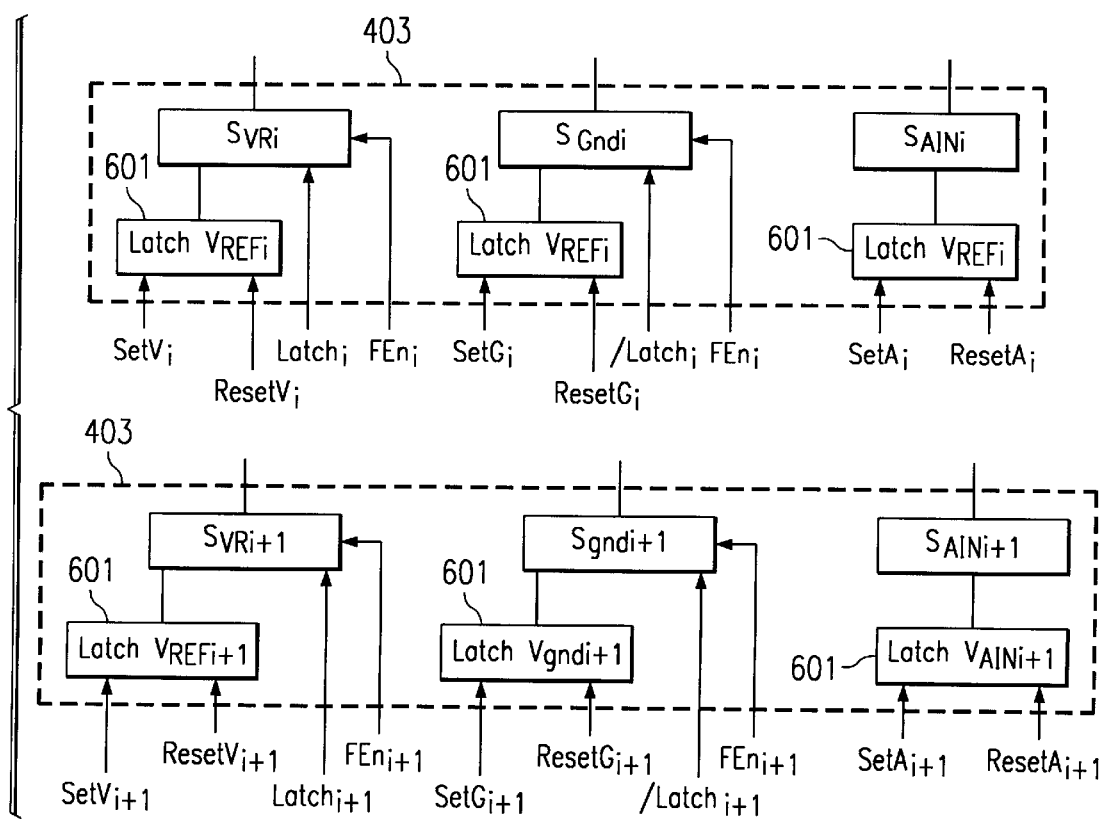
FIG. 6A is a functional block diagram of selected switches shown in FIG. 4B along with the associated return path latches.

FIG. 6A is a functional block diagram of the switches $S_{AINi}$, $S_{Gndi}$, and $S_{VRi}$, and $S_{AINi+1}$, $S_{VRi+1}$, and $S_{Gndi+}$ controlling two arbitrarily selected adjacent capacitors $C_i$ and $C_{i+1}$ in one of arrays 403a or 403b. (For discussion purposes, the primary positive and negative input paths will be considered, although the concepts described below are applicable as well to the offset compensation return paths). Each switch is associated with a register of one or more latches 601. The exemplary switches and latches of FIG. 6A, along with the timing diagram of FIG. 6B, will illustrate the preferred operation of return paths 210 for all m-number of switches 403a,b shown in FIG. 4.

Each cycle in the conversion of a sample is divided into reset and set periods. Generally, during the reset period all the switches which must be broken are broken and during the set period all the switches which must be set are set. It should be noted, that after a switch has been set to $V_{REF}$ or Gnd after a keep/don't keep decision is made for the bit, it remains set for the remainder of the conversion of the current sample.

Figure 6B:
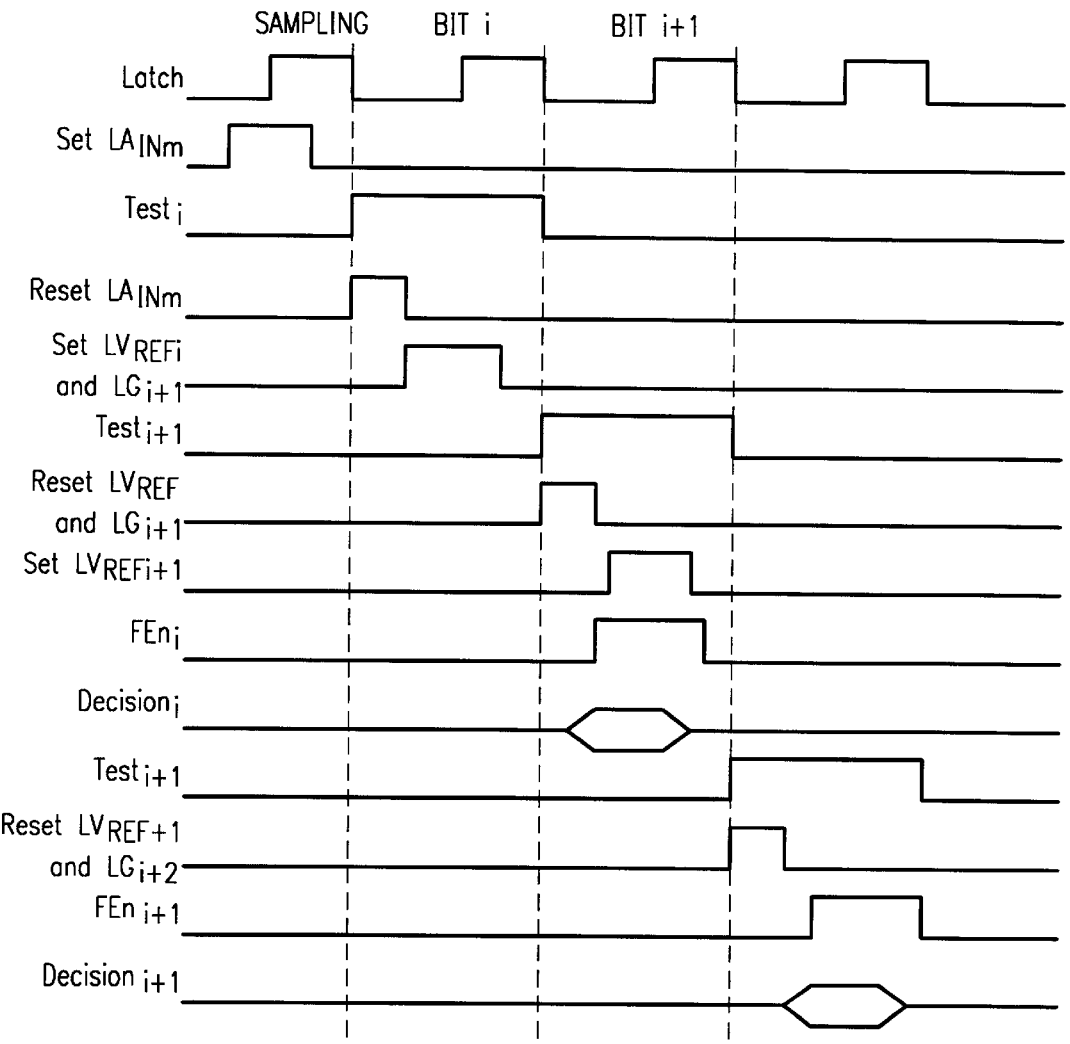
FIG. 6B is a timing diagram illustrating the preferred operation of the switches and latches of FIG. 6A.

In FIG. 6B, during the sampling phase latches $LA_{INm}$ are set (Set$A_{INm}$) such that the m-number of switches $S_{AINm}$ in arrays 403a,b couple the associated capacitors $C_m$ to the analog input $A_{IN}$. At the same time, the output LATCH of regenerative comparator/latch 209 is reset by shorting its differential outputs together. After the sampling phase is over, $LA_{INm}$ are reset (Reset$A_{INm}$) and switches $S_{AINm}$ open at the start of the conversion phase.

Assume the Bit i is the MSB and therefore the first bit to be decided. In this case, the SAR shift register sets the test bit Test$_i$ active (high). Latch $LV_{REFi}$ is set (Set $LV_{REFi}$) and the corresponding switch $S_{VRi}$ couples the bottom plate of capacitor $C_i$ to $V_{REF}$. At the same time, latch $LGnd_{i+1}$ is set (Set $LG_{j+1}$) such that switch $S_{Gndi+1}$ couples capacitor $C_{i+1}$ to Gnd. (The remaining capacitors in the array are also coupled to Gnd for the initial bit cycle and remain set until reset during the specific bit decision). The comparator/latch 209 output LATCH resets and then begins to regenerate as the comparator input voltage difference starts the latch output to swing for Bit$_i$.

The output of Latch for Bit$_i$ does not close either switch $SV_{REF}$ or $S_{gnd}$ depending on the decision, until after the start the conversion cycle for Bit$_{i+}$, (i.e. Test$_{i+1}$ active). Decision$_i$ is enabled for Bit$_i$ by FEn$_i$ and either sets $LV_{REFi}$ if the bit is to be kept or sets LGnd$_i$ if the bit is not kept. As previously mentioned, once the decision is made for Bit$_i$ this switch configuration is maintained for the conversion of the current sample.

The determination of Bit$_{i+1}$ begins with the reset of latches LGnd$_{i+1}$ and $LV_{REFi}$. The SAR shift register sets Test$_{i+1}$ active. During the set period of the cycle, latch $LV_{REFi+1}$ is set and switch $S_{VRi+1}$ couples the bottom plate of capacitor $C_{i+1}$ to $V_{REF}$ and the bit is tested. As was done for the previous bit, the latch output regenerates and is enabled such that the switches are set for Bit$_{i+1}$, during the start of the following test for the bit (Bit$_{i+2}$). (In this case, latch $LV_{REFi+1}$ is reset at the beginning of the $C_{i+2}$ cycle).

Figure 6C:
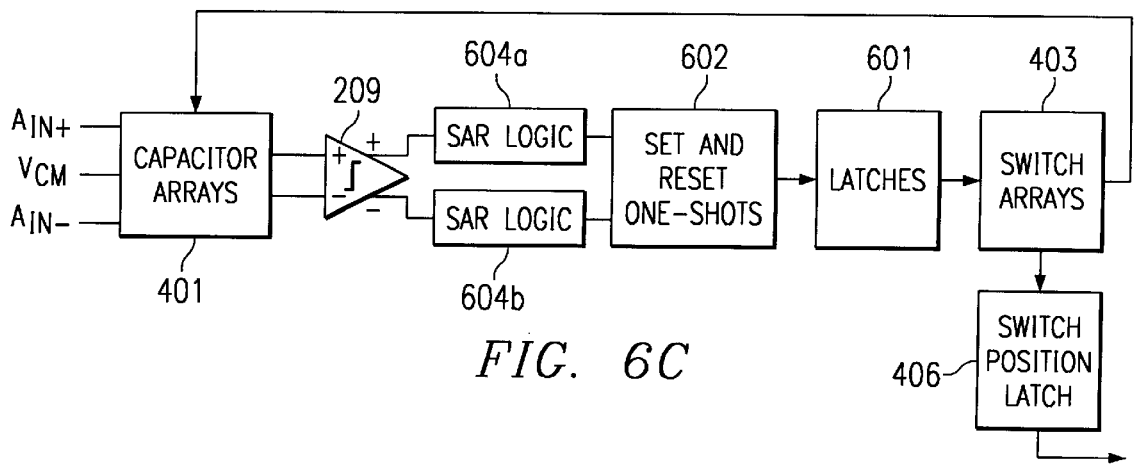
FIG. 6C is a functional block diagram of the entire preferred, return path of FIG. 2.

The set and reset signals shown in FIG. 6B can be generated in any one of a number of ways. One preferred way is through the use of set and reset one-shot circuitry 602 triggered off the SAR shift register output Test$_i$, as shown in FIG. 6C. The SAR logic discussed above is also shown here generally at 604a,b for reference.

For example, each bit can be associated with a set of one-shot circuits, one for setting corresponding latch $LV_{REFi}$, one for resetting latches $LV_{REFi}$ and $LG_{i+1}$ and for one generating (setting) the enable signal FEni.

In contrast to conventional SAR return paths were the make-before-break operation is made in series with the latch decision, according to the inventive principles, the make-before-break operation is made in parallel with the latch regeneration period. This allows the embodying return path to operate substantially faster than conventional return paths.

In contrast to conventional SAR return paths were the make-before-break operation is made in series with the latch decision, according to the inventive principles, the make-before-break operation is made in parallel with the latch regeneration period. This allows the embodying return path to operate substantially faster than conventional return paths.

While a particular embodiment of the invention has been shown and described, changes and modifications may be made therein without departing from the invention in its broader aspects, and, therefore, the aim in the appended claims is to cover all such changes and modifications as fall within the true spirit and scope of the invention.

What is claimed is:

1. A method of converting bits in a charge redistribution analog to digital converter comprising the steps of:
    sampling an input signal by coupling first and second capacitors to an analog input by setting a first set of latches controlling a first set of switches during a first set cycle; and
    testing a first bit during a first time period comprising the substeps of:
        decoupling the first and second capacitors from the analog input by resetting the first set of latches controlling the first set of switches; and
        coupling the first capacitor to a first reference voltage and the second capacitor to a second reference voltage by setting a second set of latches controlling a second set of switches.

2. The method of claim 1 further comprising the step of testing a second bit during a second time period comprising the substeps of:

decoupling the first capacitor from the first reference voltage and the second capacitor from the second reference voltage by resetting the second set of latches; and coupling the second capacitor to the first reference voltage by setting a third latch controlling a third switch.

3. The method of claim 2 further comprising the step of selectively coupling the first capacitor to one of the first and second reference voltages during the second time period in response to said step of testing the first bit.

4. The method claim 3 wherein said step of selectively coupling the first capacitor to one of the first and second reference voltages is performed subsequent to said substep of decoupling the first capacitor from the first reference voltage during said step of converting the second bit.

5. The method of claim 3 further comprising the step of resetting a comparator-latch during the first time period, the comparator-latch regenerating during the second time period to selectively couple the first capacitor to a selected one of the first and second reference voltages.

6. The method of claim 1 and wherein said substep of coupling comprises the substeps of coupling the first capacitor to a positive reference voltage and the second capacitor to ground.

7. The method of claim 1 wherein said step of testing the first bit is partitioned into latch set and reset cycles, said substep of decoupling performed during the latch reset cycle and said substep of coupling performed during the latch set cycle.

8. A charge redistribution analog to digital converter comprising:

comparator circuitry for comparing voltages presented at first and second comparator inputs and latching to a selected one of first and second output voltages in response;

an array of bit-weighted capacitors coupled to a selected one of the first and second comparator inputs;

a plurality of switches associated with a selected capacitor of said array capacitors for selectively coupling said capacitor with an input during a sampling phase and a selected one of first and second reference voltages during a conversion phase;

a return path for controlling said plurality of switches in response to the output of the first and second voltages by the comparator circuitry, said return path including a set of latches for selectively opening ones of said plurality of switches when reset and selectively closing ones of said plurality of switches during when set, the reset and set operations non-overlapping, wherein said return path is operable during the conversion phase of a selected bit to:

decouple a capacitor representing the selected bit from a current one of the first and second reference voltage by resetting a corresponding latch during a first part of a test period for the selected bit;

couple the capacitor representing the selected bit to the first reference voltage during a second part of the test period for the selected bit by setting a corresponding latch; and selectively couple the capacitor representing the selected bit to a selected one of the first and second reference voltages concurrent with a test period for a subsequent bit by setting a corresponding latch.

9. The analog to digital converter of claim 8 wherein said return path comprises a plurality of on-shot circuits for selectively setting and resetting said latches in response to a timing signal generated by successive approximation logic.

10. The analog to digital converter of claim 8 wherein said test period is timed by a test signal generated by successive approximation logic and said return path further comprises a reset one-shot circuit for resetting said corresponding latches and a set one-shot circuit for setting said corresponding latches.

11. The analog to digital converter of claim 8 wherein said first comparator input comprises a positive comparator input.

12. The analog to digital converter of claim 8 wherein said first comparator input comprises a negative comparator input.

13. The analog to digital converter of claim 8 wherein said array of bit-weighted capacitors comprises an array of offset compensation capacitors.

14. A return path for use in a switched capacitor circuit including an array of capacitors and a plurality of switches for selectively coupling voltages to said capacitors comprising:

a set of latches for selectively controlling said plurality of switches during time periods partitioned into non-overlapping reset and set cycles and operable to:

decouple a selected one of the capacitors from a current voltage in the reset cycle of a first time period;

coupling the selected capacitor to a selected reference voltage in the set cycle of the first time period;

decouple the selected capacitor from the selected reference voltage during a reset cycle of a second time period; and selectively recoupling the selected capacitor to the selected reference voltage during the second time period in response to an output of a comparator forming a portion of said switched capacitor circuit.

15. The return path of claim 14 and further comprising successive approximation logic for generating a test signal defining the time period.

16. The return path of claim 15 and further comprising one-shot circuitry for generating reset and set signals from the test signals to selectively set and reset selected ones of said latches.

* * * * *